US012796456B2

(12) United States Patent
Park et al.

(10) Patent No.: US 12,796,456 B2
(45) Date of Patent: Nov. 10, 2026

(54) HEAT SPREADER WITH EXTENSIONS FOR HOLDING A SEMICONDUCTOR DEVICE, AND SEMICONDUCTOR DEVICE INCLUDING THE SAME

(71) Applicant: STATS ChipPAC Pte. Ltd., Singapore (SG)

(72) Inventors: SooHan Park, Incheon (KR); KyungEun Kim, Incheon (KR); YoSep Park, Incheon (KR); Inweon Ra, Seoul (KR)

( * ) Notice: Subject to any disclaimer, the term of this patent is extended or adjusted under 35 U.S.C. 154(b) by 463 days.

(21) Appl. No.: 18/315,496

(22) Filed: May 10, 2023

(65) Prior Publication Data

US 2023/0369165 A1 Nov. 16, 2023

(30) Foreign Application Priority Data

May 13, 2022 (CN) ......................... 202210523989.9

(51) Int. Cl.

*H10W 40/22* (2026.01)
*H10W 40/60* (2026.01)
*H10W 70/40* (2026.01)
*H10W 70/68* (2026.01)

(Continued)

(52) U.S. Cl.

CPC ........... *H10W 40/22* (2026.01); *H10W 40/60* (2026.01); *H10W 70/481* (2026.01);

(Continued)

(58) Field of Classification Search

CPC ....... H01L 23/367; H01L 21/50; H01L 21/60; H01L 23/13; H01L 23/40;

(Continued)

(56) References Cited

U.S. PATENT DOCUMENTS 5,909,057 A 6/1999 McCormick et al.
6,011,304 A 1/2000 Mertol (Continued)

FOREIGN PATENT DOCUMENTS

CN 1819164 A 8/2006
CN 102215658 A 10/2011

(Continued)

OTHER PUBLICATIONS

The Search Report for the counterpart Chinese patent application 202210523989.9, mailed on Jul. 19, 2026.

*Primary Examiner* — Mohammad M Hoque

(74) *Attorney, Agent, or Firm* — Junhe Law Office P.C.; Yi Zhang

(57) ABSTRACT

A heat spreader can be used with a semiconductor component. The heat spreader includes: a body having a bottom surface to be in thermal contact with the semiconductor component, and a top surface opposite to the bottom surface; a plurality of holes disposed at a non-peripheral region of the body, wherein each hole passes through the body between the top surface and the bottom surface; and a plurality of extensions each being disposed within one of the plurality of holes and extending from the top surface and downward below the bottom surface, wherein the plurality of extensions are configured to hold the semiconductor component when the heat spreader is mounted with the semiconductor component.

6 Claims, 5 Drawing Sheets

(51) Int. Cl.
*H10W 72/00* (2026.01)
*H10W 95/00* (2026.01)

(52) U.S. Cl.
CPC ......... *H10W 70/68* (2026.01); *H10W 72/071* (2026.01); *H10W 95/00* (2026.01)

(58) Field of Classification Search
CPC ........... H01L 23/49562; H01L 23/3114; H01L 21/4882; H10W 40/22; H10W 40/60; H10W 70/481; H10W 70/68; H10W 72/071; H10W 95/00; H10W 74/129; H10W 40/641; H10W 40/037
USPC .......................................................... 257/292
See application file for complete search history.

(56) References Cited

U.S. PATENT DOCUMENTS

| | | | | |
|---|---|---|---|---|
| 6,093,961 | A | 7/2000 | McCullough | |
| 6,114,761 | A | 9/2000 | Mertol et al. | |
| 6,219,238 | B1 | 4/2001 | Andros et al. | |
| 6,343,012 | B1 | 1/2002 | Rife | |
| 7,224,057 | B2 | 5/2007 | Yang | |
| 9,462,673 | B2 * | 10/2016 | Zhang | H05K 1/0203 |
| 11,276,625 | B2 * | 3/2022 | Kumar | H01L 23/00 |
| 2009/0294941 | A1 | 12/2009 | Oh et al. | |
| 2010/0218929 | A1 * | 9/2010 | Sawada | H10W 40/037 165/185 |
| 2018/0068993 | A1 * | 3/2018 | Patel | H01L 23/04 |
| 2020/0343157 | A1 | 10/2020 | Dry | |

FOREIGN PATENT DOCUMENTS

| | | | | |
|---|---|---|---|---|
| CN | 102474082 | A | | 5/2012 |
| CN | 206326267 | U | | 7/2017 |
| CN | 110315071 | A | | 10/2019 |
| CN | 114361115 | A | | 4/2022 |
| TW | M252049 | U | | 12/2004 |
| TW | M332362 | U | * | 5/2008 |

* cited by examiner

HEAT SPREADER WITH EXTENSIONS FOR HOLDING A SEMICONDUCTOR DEVICE, AND SEMICONDUCTOR DEVICE INCLUDING THE SAME

CROSS-REFERENCE TO RELATED APPLICATION

This application claims the benefit of the filing date of Chinese patent application No. 202210523989.9 filed on May 13, 2022, the disclosure of which is hereby incorporated by reference in its entirety.

TECHNICAL FIELD

The present application generally relates to semiconductor technologies, and more particularly, to a heat spreader for use with a semiconductor component, a semiconductor device incorporating the heat spreader, and a method for making the semiconductor device.

BACKGROUND OF THE INVENTION

Semiconductor devices are commonly found in modern electronic products, which perform a wide range of functions, such as signal processing, high-speed calculations, transmitting and receiving electromagnetic signals, controlling electronic devices, and creating visual images for television displays. An integrated circuit can be fabricated within a semiconductor die. The semiconductor die can also be referred to as a chip, and the die can be a so-called "flip-chip". A flip-chip has a surface that includes conductive protrusions, which can be referred to as "bumps".

During operation, the integrated circuits in the die can generate heat which requires a heat spreader to transfer from the die to a surrounding environment. A conventional heat spreader is usually attached onto a substrate via its foot portion, and thus a mounting space is required on the substrate. However, according to recent demands, lots of additional components are mounted on the substrate and surrounding the die, such as a big die and small components arrangement used in a fcBGA-SiP package. Under such circumstances, there may not be enough space on the substrate for mounting the heat spreader anymore. In addition, the conventional heat spreaders are unlikely to fulfill the growing demands of heat dissipation due to the increasing density of electronic components integrated within a single semiconductor package.

Therefore, a need exists for an improved heat spreader for use with semiconductor components.

SUMMARY OF THE INVENTION

An objective of the present application is to provide a heat spreader for use with a semiconductor component, a semiconductor device incorporating the heat spreader and a method for making the semiconductor device.

In an aspect of the present application, there is provided a heat spreader for use with a semiconductor component. The heat spreader comprises: a body having a bottom surface to be in thermal contact with the semiconductor component, and a top surface opposite to the bottom surface; a plurality of holes disposed at a non-peripheral region of the body, wherein each hole passes through the body between the top surface and the bottom surface; and a plurality of extensions each being disposed within one of the plurality of holes and extending from the top surface and downward below the bottom surface, wherein the plurality of extensions are configured to hold the semiconductor component when the heat spreader is mounted with the semiconductor component.

In an embodiment, the plurality of holes and the plurality of extensions are arranged in a two-dimensional array on the body.

In an embodiment, the plurality of extensions are integrally formed with the body.

In an embodiment, the plurality of extensions are bent away from the top surface to hold the semiconductor component therein.

In an embodiment, the plurality of holes are formed by cutting the body.

In an embodiment, the plurality of holes and the plurality of extensions are formed by cutting in the body non-closed slits each separating an extension from a respective hole.

In another aspect of the present application, there is provided a semiconductor device, comprising: a semiconductor component; a heat spreader, wherein the heat spreader comprises: a body having a bottom surface in thermal contact with the semiconductor component, and a top surface opposite to the bottom surface; a plurality of holes disposed at a non-peripheral region of the body, wherein each hole passes through the body between the top surface and the bottom surface; and a plurality of extensions each being disposed within one of the plurality of holes and extending from the top surface and downward below the bottom surface, wherein the plurality of extensions are configured to hold the semiconductor component.

In a further aspect of the present application, there is provided a method for making a semiconductor device, comprising: providing a semiconductor component; providing a heat spreader having a body, a plurality of holes and a plurality of extensions; wherein the body has a bottom surface and a top surface opposite to the bottom surface, and the plurality of holes are disposed at a non-peripheral region of the body; attaching the bottom surface of the heat spreader with the semiconductor component; and bending the plurality of extensions away from the top surface of the body and downward below the bottom surface of the body to engage each extension with a side face of the semiconductor component.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain the principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
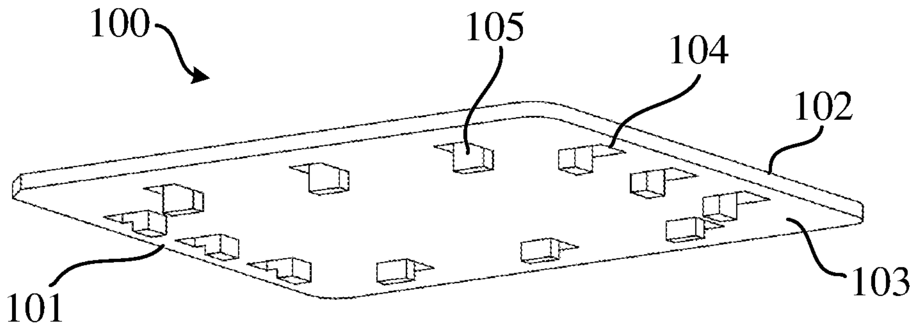
FIG. 1 illustrates a perspective view of a heat spreader for use with a semiconductor component.

FIG. 1 illustrates a perspective view of a heat spreader for use with a semiconductor component. In some embodiments, the heat spreader can be attached to a semiconductor package to dissipate heat from the semiconductor package. In some other embodiments, the heat spreader can be attached to a semiconductor die.

Referring to FIG. 1, the heat spreader 100 includes a body 101 with a top surface 102 and a bottom surface 103. The bottom surface 103 can be attached to a semiconductor component and thus in thermal contact with a surface of the semiconductor component. The top surface 102 is generally opposite to the bottom surface 103. The body 101 has a plurality of holes 104 that pass through the body and between the top surface 102 and the bottom surface 103. For a hole 104 of the body 101, an extension 105 extends from the top surface 102, passes through the hole 104, and further extends downward below the bottom surface 103. The extensions 105 are substantially perpendicular to the body 101 and thus can engage respective side faces of the semiconductor component. As shown in FIG. 1, all the holes 104 have respective extensions 105 which extend below the bottom surface 103. As such, the semiconductor component can be mounted with such heat spreader 100 within a region or a virtual frame defined by the extensions 104. The extensions 105 operate as anchor points to the semiconductor component to prevent any lateral movement of the heat spreader 100 relative to the semiconductor component. The extension 105 may be formed by bending a tab within the respective hole 104. In some embodiments, only a portion of the holes 104 may have the extensions 105, while the other holes may be blocked by the extensions or tabs that are not bent away from the body 101. In this way, the heat spreader 100 can have an adjustable mounting region, and thus can be mounted onto a semiconductor component according to the specific dimension of the semiconductor component. In some embodiments, one or more holes 104 may have more extensions 104.

In some embodiments, the extensions 105 may be stamped or pressed to form on its surface a convex portion such as a contact point or a rib. When the heat spreader 100 is attached to a semiconductor component, the convex portions can be in direct contact with the side face of the semiconductor component and increase frictions between the extensions 105 and the semiconductor component. In some preferred embodiments, there may be grooves or recesses on the side faces of the semiconductor component, which may receive the respective convex portions of the extensions 105 when the heat spreader 100 is attached with the semiconductor component. In this way, the engagement between the heat spreader 100 and the semiconductor component can be further improved.

In the embodiment shown in FIG. 1, the holes 104 and the associated extensions 105 are located at non-peripheral regions of the body 101. That is to say, the virtual frame defined by the holes 104 and extensions 105 may have a footprint smaller than that of the entire heat spreader 100. In that case, the heat spreader 100 can have a greater footprint than a semiconductor component connected thereto, which provides an improved heat dissipation performance.

In some embodiments, the body 101 and the extensions 105 are formed as an integral structure and are thus made of the same material. Specifically, the holes 104 and extensions 105 can be formed by cutting such as laser cutting. For example, a non-closed slit can be formed by cutting the body 101, which defines the hole and the tab within the hole. Further, the tab can be bent by an angle substantially equal to 90 degrees relative to the bottom surface 103. In some examples, the tabs can be bent by another angle such as 80 degrees, 85 degrees, 88 degrees, 89 degrees or other suitable degrees. In this way, the bent tabs, or the extensions, can provide greater holding forces when the heat spreader 100 is mounted onto a semiconductor component. It can be understood that the heat spreader 100 can be made of metal or other materials with certain flexibility and rigidness, which creates interference fit between the extensions and the semiconductor component. In some other examples, the extensions 105 can be attached to the body 101 via adhering, welding or other suitable attachment process. Alternatively, the extensions can be made of a material different from the material of the body 101.

The heat spreader 100 as shown in FIG. 1 is generally shaped as a plate, and the holes 104 and extensions 105 define an array of a square or rectangular shape. However, one of ordinary skill in the art would appreciate that the heat spreader 100, the holes 104 and extensions 105 may take form of any other suitable shapes. For example, the array of holes 104 and extensions 105 may include two rows, wherein a first row of extensions 105 can engage with a first side face of the semiconductor component while the second row of extensions 105 can engage with a second side face of the semiconductor component which is opposite to the first side face. In this way, the semiconductor component can be clamped between the two rows of extensions. In another example, the array of extensions 105 may include four sets of extensions, and each set of extensions can be aligned with a corner of the semiconductor component which is generally shaped as a square or a rectangle. In addition, the heat spreader 100 may be made of one or more materials selected from a variety of thermally conductive materials such as well-known ceramics or metallic materials as desired. Some exemplary materials include copper, nickel jacketed copper, anodized aluminum, aluminum-silicon-carbon, aluminum nitride, boron nitride or the like.

Figure 2:
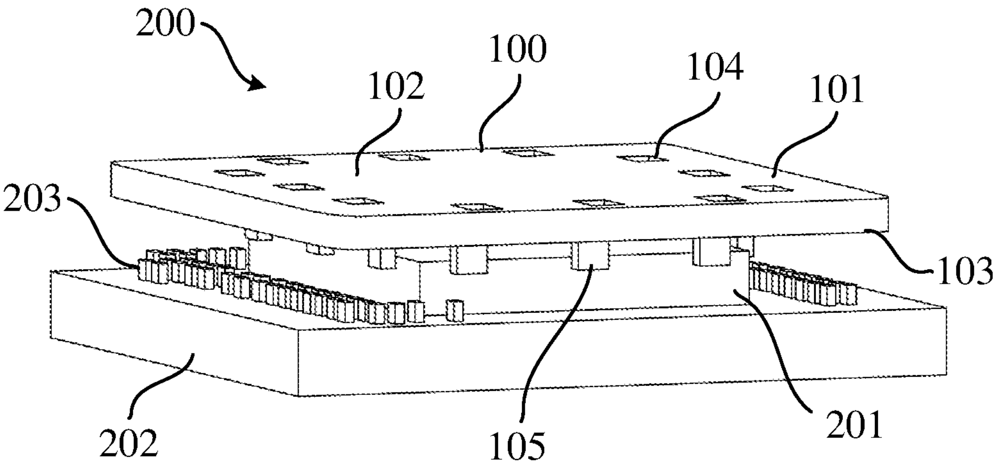
FIG. 2 illustrates a perspective view of a semiconductor device incorporating the heat spreader 100 as shown in FIG. 1.

FIG. 2 illustrates a perspective view of a semiconductor device incorporating the heat spreader 100 as shown in FIG. 1 according to an embodiment of the present application.

Now referring to FIG. 2, the semiconductor device 200 includes a semiconductor component 201 such as a semiconductor package or a semiconductor die, and a heat spreader 100 disposed over the semiconductor component 201. The semiconductor component 201 may be any other types of semiconductor package or die. A bottom surface 103 of the heat spreader 100 is in thermal connection with a top surface of the semiconductor component 201. Although not shown in FIG. 2, the heat spreader 100 may be in thermal contact with the semiconductor component 201 by way of thermal interface materials, such as thermal interface material layers. In some embodiments, the thermal interface material layers may be solder-based, which has certain advantages for high powered devices due to the ability of solder to withstand higher temperatures and the greater thermal conductivity thereof. In some other embodiments, the thermal interface material layers may also be an organic material.

As shown in FIG. 2, a plurality of the extensions 105 bend away from a top surface 102 of a body 101 of the heat spreader 100 to engage side faces of the semiconductor component 201, such that the semiconductor component 201 is surrounded and secured by the extensions 105. In some examples, the semiconductor component 201 can be further attached to a substrate 202 such as a printed circuit board or the like, while the heat spreader 100 is not in contact with the substrate 202. Thus, the heat spreader 100 may not occupy a region on the substrate 202, which allows that some other electrical components can be mounted onto the substrate 202, even in a region very close to the semiconductor component 201. For example, FIG. 2 shows that a plurality of other types of electrical components 203 such as resistors are also attached to the substrate 202 and surround the semiconductor component 201. In such a configuration, there may not be enough space for attaching a foot portion of conventional heat spreaders to the substrate 202. However, by employing the heat spreader 100 according to the embodiment of the present application, the heat spreader 100 can be secured onto the semiconductor component 201 for the heat dissipation, floating above the substrate. Furthermore, as aforementioned, since the holes 104 and the extensions 105 of the heat spreader 100 are not at the peripheral region of the body 101, the body 101 can extend in a direction substantially parallel with the substrate 202, which provides a greater area for heat dissipation.

The semiconductor device 200 as shown in FIG. 2 has only one semiconductor component 201. In some embodiments, the semiconductor device 200 may have two or more semiconductor components attached to the substrate 202. Under such circumstance, the extensions 105 may be divided into at least two sets, and each set of the extensions 105 may be used to secure one of the semiconductor components. In some embodiments, a large regular-shaped (e.g., square) array of holes can be pre-cut in the body of the heat spreader, without the extensions being bent downward from the body. In this way, some of the extensions may be bent downward while the other may not be bent downward, depending on what specific semiconductor component is to be mounted with the heat spreader.

Figure 3:
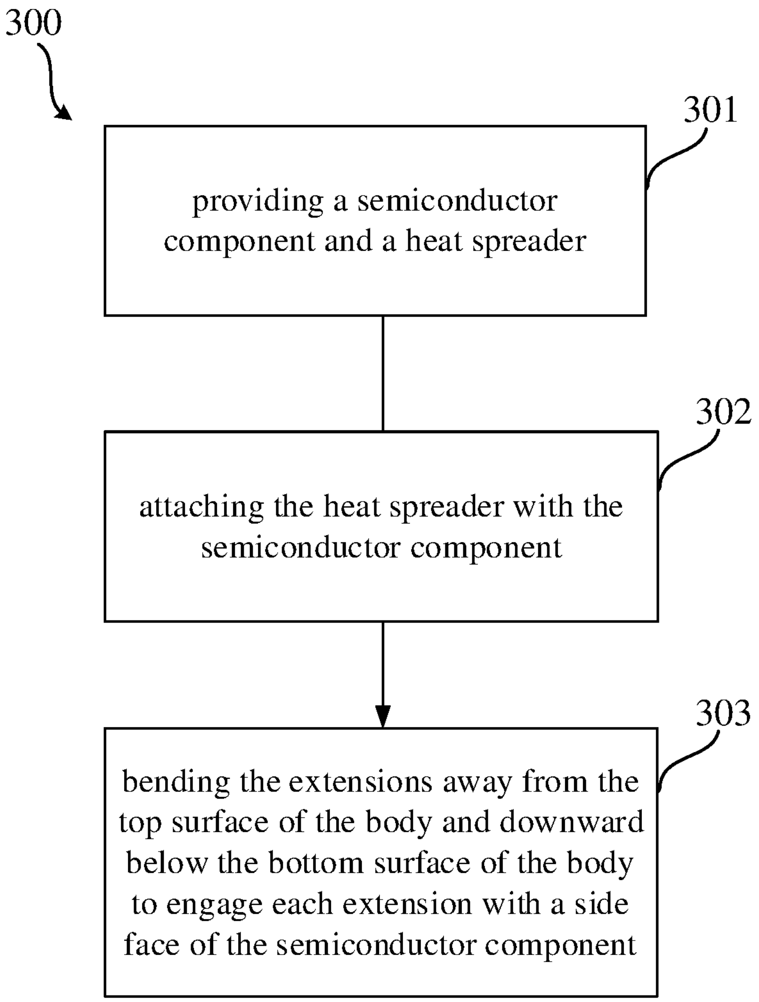
FIG. 3 is a flowchart illustrating a method for making a semiconductor device according to an embodiment of the present application.

FIG. 3 is a flowchart illustrating a method for making a semiconductor device according to an embodiment of the present application. For ease of explanation, the method 300 is described with reference to the semiconductor device 200 as shown in FIG. 2. However, the method 300 could be used to make any other suitable electronic devices or systems.

At step 301, at least one semiconductor component 201 and a heat spreader are provided. The semiconductor component 201 can be attached to the substrate 202. In some embodiments, two or more semiconductor components 201 can be provided and the additional electronic components 203 may be attached to the substrate 202 as well. Moreover, the heat spreader 100 has a body 101 with a top surface 102 and a bottom surface 103. A plurality of holes 104 are disposed at a non-peripheral region of the body 101. At this time, unbent tabs may be formed within the holes respectively.

At step 302, the heat spreader 100 and the semiconductor component 201 are attached with each other such that their facing faces are in thermal contact with each other. In particular, the bottom surface 103 of the heat spreader 100 may be in direct contact with the semiconductor component 201. Alternatively, the heat spreader 100 can be in thermal contact with the semiconductor component 201 by way of thermal interface material, such as thermal interface material layers.

At step 303, the extensions 105 are bent away from the top surface 102 of the body 101, and downward below the bottom surface 103, to engage respective side faces of the semiconductor component 201. As can be seen in FIG. 2, the extensions 105 are bent to surround the semiconductor component 201 without contacting the substrate 202 or the additional electronic components 203. Therefore, the semiconductor component 201 can be firmly hold within the array of extensions 105 and lateral movement of the semiconductor component 201 with respect to the heat spreader 100 can be avoided. Compared with the conventional heat spreader which requires a slope portion and a foot portion for the attachment with the substrate, the heat spreader 100 can at least save the space for the additional electronic components 203, especially for fcBGA-SiP packages with a big die and small additional adjacent electronic components.

It should be noted that although in the above method 300 the attaching step 302 is prior to the bending step 303, in some other embodiments, the extensions 105 can be pre-bent, i.e., prior to being attached with the semiconductor component 201. For example, the extensions 105 can be pre-bent downward below the bottom surface 103. Afterwards, the heat spreader can be further attached with the semiconductor component, and if any of the extensions cannot fit the side face of the semiconductor component well, an angle of the extension can be adjusted.

Figure 4A:
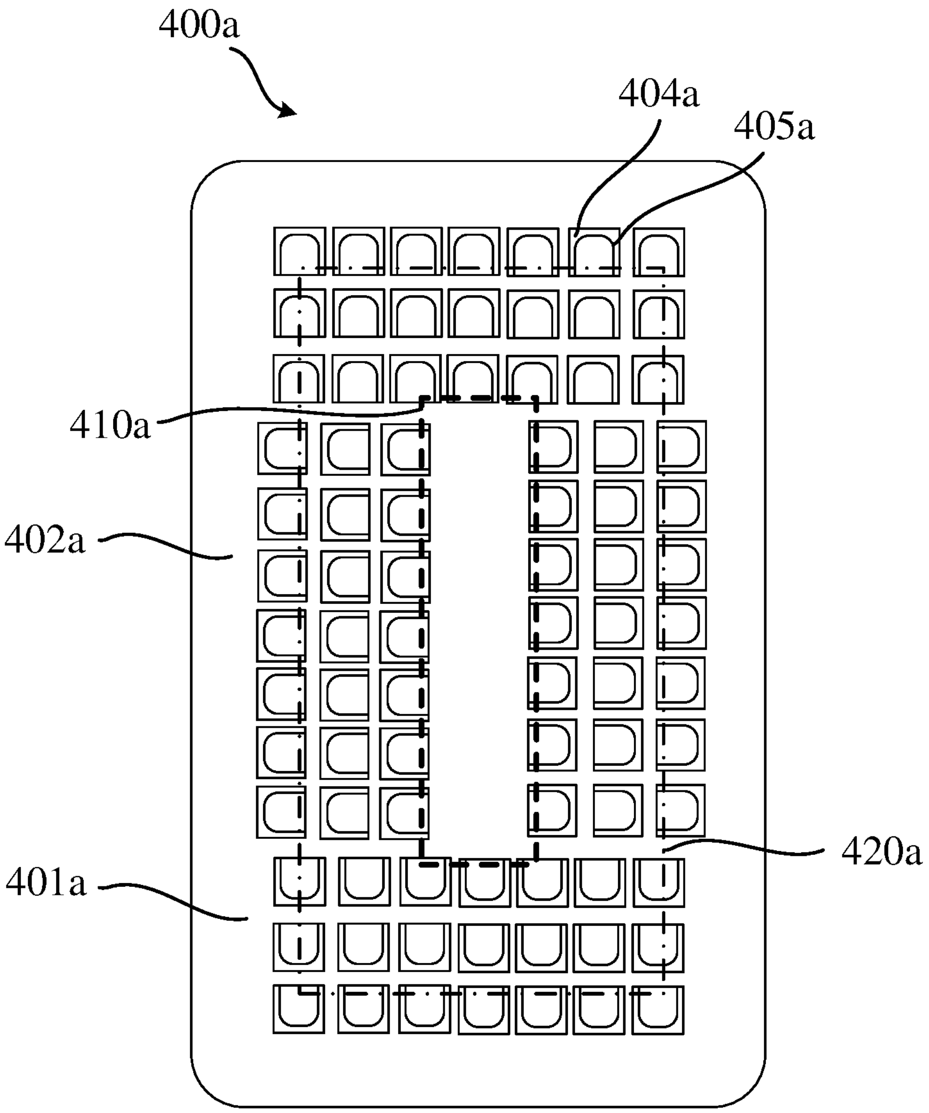
FIGS. 4A and 4B illustrate top views of heat spreaders 400*a* and 400*b* according to embodiments of the present application.
Figure 4B:
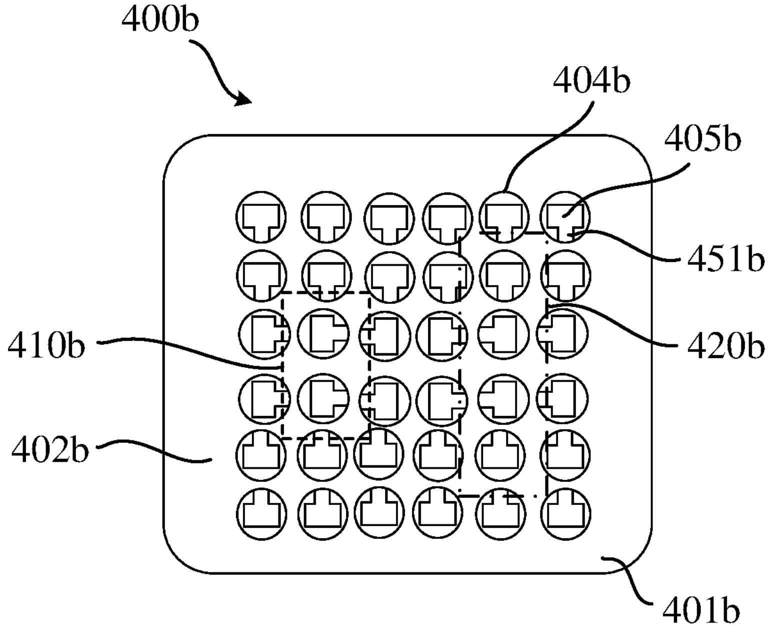

FIGS. 4A and 4B illustrate top views of heat spreaders 400*a* and 400*b* according to two embodiments of the present application. Now referring to FIG. 4A, the heat spreader 400*a* has a body 401*a*, and a plurality of holes 404*a* that pass through the body 401*a*. Within each hole 404*a*, there is an extension 405*a* connected with the body 401*a*, and the extension 405*a* can be bent away from the top surface 402*a*. The plurality of holes 404*a* with extensions 405*a* are arranged in a two-dimensional array on the body 401*a*, and different rows of the extensions 405*a* can be selectively bent away from the top surface to engage the semiconductor component with different dimensions.

Specifically, the dot-and-dash line rectangle shown in FIG. 4A illustrates a contour of a semiconductor component 420*a* disposed below the heat spreader 400*a*. At least a part of the extensions 405*a* in the outmost rows in the array are aligned with a periphery of the semiconductor component 420*a*. Thus, these extensions can be bent away from the top surface 402*a* to surround and secure the semiconductor component 420*a*. In addition, another dotted line rectangle shown in FIG. 4A shows a contour of another semiconductor component 410*a* which has a smaller area than that of the semiconductor component 420*a*. If the heat spreader 400*a* is used to connect with the semiconductor component 410*a*, then a plurality of extensions 405*a* in the innermost rows of the array which are aligned with a periphery of the semiconductor component 410*a* can be bent away from the top surface 402*a* to surround and secure the semiconductor component 410*a*.

Now referring to FIG. 4B, the heat spreader 400*b* has a body 401*b*, and a plurality of holes 404*b* that pass through the body 401*b*. Within each hole 404*b*, there is an extension 405*b* connected with the body 401*b*. The holes 404*b* are circularly shaped, which are different from the holes 404*a* shown in FIG. 4A. As aforementioned, one of ordinary skill in the art would appreciate that any other shapes or configurations may be used for the holes 404*b* or extensions 405*b* as desired. A neck portion 451*b* is further formed within the hole 404*a* between the extension 405*b* and the body 401*b*, which may operate as a hinge for the extension 405*b* when it is bent away from the body 401*b*. In some embodiments, the extensions 405*b* may have more than one neck portions connecting the extensions 405*b* with the body 401*b*, and the neck portions may have different orientations with respect to the hole 404*b*. In that case, the heat spreader 400*b* can connect with different sized semiconductor components.

As shown in FIG. 4B, the plurality of holes 404*b* with extensions 405*b* are in a two-dimensional array on the body 401*b*. In some embodiments, the extensions 405*b* may be bent to engage or secure two or more semiconductor components. Specifically, the dot-and-dash line rectangle in FIG. 4B illustrates a contour of a semiconductor component 420*b* disposed below a right portion of the heat spreader 400*b* and the dotted line rectangle illustrates another semiconductor component 410*b* disposed below a left portion of the heat spreader 400*b*. Some of the extensions 405*b* which are aligned with respective peripheries of the semiconductor component 410*b* and the semiconductor component 420*b* can be bent away from the top surface 402*b*. Therefore, the heat spreader 400*b* can be simultaneously mounted with two or more semiconductor components arranged in a variety of arrangements, which may greatly broader its application for different types of semiconductor devices.

The discussion herein included numerous illustrative figures that showed various portions of a heat spreader for use with a semiconductor component and method of manufacturing thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A heat spreader for use with a semiconductor component, comprising:
- a body having a bottom surface to be in thermal contact with the semiconductor component, and a top surface opposite to the bottom surface;
- a plurality of holes disposed at a non-peripheral region of the body, wherein each hole passes through the body between the top surface and the bottom surface; and
- a plurality of extensions each being disposed within one of the plurality of holes and extending from the top surface and downward below the bottom surface, wherein the plurality of extensions is configured to hold the semiconductor component when the heat spreader is mounted with the semiconductor component;
- wherein each of the extensions is formed by bending a tab within the respective hole downwards, such that the tab extends below the bottom surface.

2. The heat spreader of claim 1, wherein the plurality of holes and the plurality of extensions are arranged in a two-dimensional array on the body.

3. The heat spreader of claim 1, wherein the plurality of extensions is integrally formed with the body.

4. The heat spreader of claim 3, wherein the plurality of extensions is bent away from the top surface to hold the semiconductor component therein.

5. The heat spreader of claim 3, wherein the plurality of holes is formed by cutting the body.

6. The heat spreader of claim 1, wherein the plurality of holes and the plurality of extensions are formed by cutting in the body non-closed slits each separating an extension from a respective hole.

* * * * *